(12) United States Patent  
Hallitschke et al.

(10) Patent No.: US 6,739,893 B2
(45) Date of Patent: May 25, 2004

(54) ELECTRONIC MODULE

(75) Inventors: Frank Hallitschke, Hepberg (DE); Johann Schneider, Wettstetten (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days.

(21) Appl. No.: 10/257,096

(22) PCT Filed: Apr. 3, 2001

(86) PCT No.: PCT/EP01/03741

§ 371 (c)(1), (2), (4) Date: Jan. 2, 2003

(87) PCT Pub. No.: WO01/78197

PCT Pub. Date: Oct. 18, 2001

(65) Prior Publication Data

US 2004/0014356 A1 Jan. 22, 2004

(30) Foreign Application Priority Data

Apr. 7, 2000 (DE) .......................................... 100 17 335

(51) Int. Cl.[7] .............................................. H01R 13/74
(52) U.S. Cl. ........................ 439/248; 439/553; 439/557; 439/76.1
(58) Field of Search ................................. 439/247, 248, 439/553, 557, 76.2, 76.1

(56) References Cited

U.S. PATENT DOCUMENTS

| 4,703,397 | A |   | 10/1987 | Minoura et al. | |
| 5,263,871 | A |   | 11/1993 | Sano | |
| 5,651,683 | A | * | 7/1997 | Shimamura et al. | 439/34 |
| 5,800,208 | A |   | 9/1998 | Ishizuka et al. | |
| 6,155,857 | A | * | 12/2000 | Kato et al. | 439/248 |
| 6,234,817 | B1 | * | 5/2001 | Hwang | 439/247 |
| 6,437,986 | B1 | * | 8/2002 | Koshiba | 361/752 |
| 6,443,779 | B2 | * | 9/2002 | Suzuki | 439/701 |
| 6,450,822 | B1 | * | 9/2002 | Eller | 439/248 |
| 6,575,794 | B1 | * | 6/2003 | Nakamura | 439/701 |

FOREIGN PATENT DOCUMENTS

| DE | 19540874 | 5/1996 |
| EP | 0153632 | 9/1985 |
| EP | 0923172 | 6/1996 |
| EP | 0834966 | 4/1998 |

* cited by examiner

Primary Examiner—Gary F. Paumen
(74) Attorney, Agent, or Firm—W. F. Fasse; W. G. Fasse

(57) ABSTRACT

Electronic module with components and contact elements arranged on a circuit support. There is suggested a simple and economical arrangement with a plug-in connection integrated in the housing or at least one housing part of the electronic module, while enabling a tolerance compensation. For this, there is provided an insert part comprising pin openings and being movably supported in a recess of the housing or housing part. Through an over-dimension at the junction point of insert part and housing or housing part, an orienting of the pin openings of the insert part with respect to the contact elements is enabled during the formation of the plug-in connection by joining the insert part with the circuit support. Electronic module as a control device in the motor vehicle field.

14 Claims, 5 Drawing Sheets

ELECTRONIC MODULE

Figure 1:
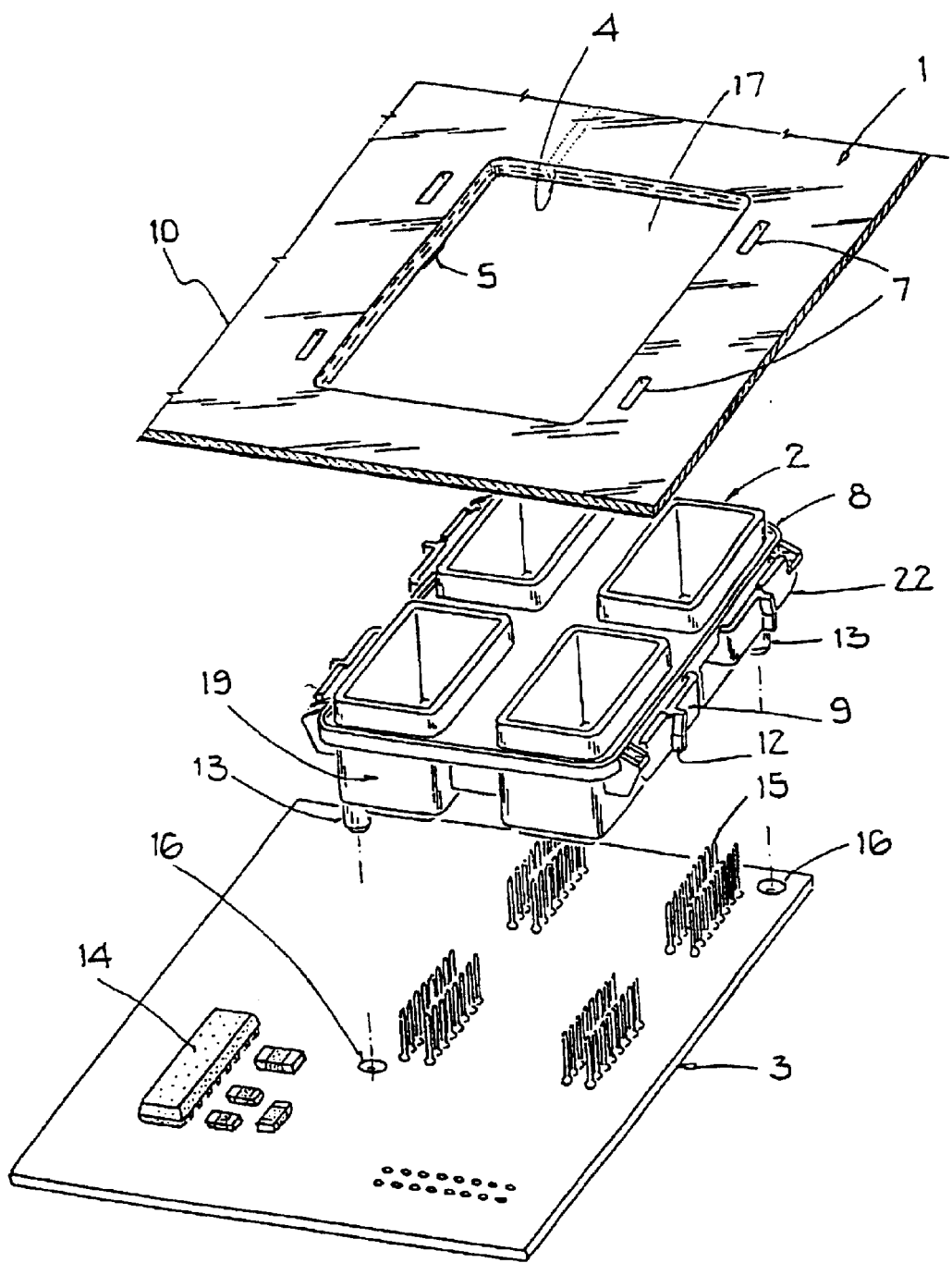

Electronic assemblies or modules are used for various applications and purposes in many fields; for example, in the motor vehicle field, electronic modules are provided as control devices (for example as motor control devices or as door control devices) for processing the measurement signals of sensors and the output signals of actuators as well as for controlling various aggregate or assembly functions or components of the motor vehicle, or are in use as fuse and relay boxes.

Electronic modules typically consist of a circuit carrier or support (for example a circuit board) and a circuit arrangement that is arranged on this circuit support and that consists of components (for example mounted by means of solder mounting or adhesive mounting) and contact elements (for example press-in or insertion contacts protruding perpendicularly to the circuit support, realized through use of the press-in or insertion technique). For protection against environmental influences, the circuit arrangement is enclosed by a housing. In order that the circuit arrangement contained in the housing can be contacted, at least one plug-in socket is integrated in the housing. Each one of the plug-in sockets comprises a certain number of openings—so-called pin openings. The contact elements arranged on the circuit support are positioned so that respectively one contact element is lead to the outside centrally through a corresponding pin opening of a plug-in socket. The contact elements of a plug-in socket can be contacted via a connection plug fitting to the plug-in socket.

Due to production tolerances, various thermal expansions, and the hygroscopic characteristics (water take-up or moisture take-up) of the housing and of the circuit support, the (exact) positioning of the contact elements relative to the pin openings of the plug-in sockets is problematic, especially in connection with large housing dimensions and a plurality of plug-in sockets integrated in the housing. Moreover, with the use of press-in contacts as contact elements, there are especially high demands on the central positioning of the individual contact elements with respect to the pin openings of the corresponding plug-in socket.

It is the underlying object of the invention to specify an electronic assembly or module that especially comprises a simple construction and low costs, a high reliability and a simplified production, as well as advantageous characteristics with respect to the positioning of the contact elements to the pin openings of the plug-in sockets and the loading upon the contacting with the external connection plug.

This object is achieved according to the invention by the features of the patent claim 1. Advantageous embodiments of the electronic module are the subject matter of the further patent claims.

In the presented electronic module, at least one plug-in socket is decoupled from the housing of the electronic module (supported floatingly or movably in the housing of the electronic module), so that the pin openings of the plug-in sockets can be oriented according to the circuit support or according to the contact elements arranged on the circuit support, so that thereby the pin openings are exactly positionable. Moreover, several plug-in sockets can be collected or assembled together to form a plug-in socket group, and, in their entirety, may be decoupled from the housing of the electronic module (supported floatingly or movably in the housing of the electronic module). The number of the plug-in sockets of a plug-in socket group is freely selectable. Suitably, neighboring plug-in sockets are grouped together to form a plug-in socket group, in order to keep the absolute dimensions of the resulting plug-in socket group small.

The housing enclosing the circuit arrangement may, for example, be assembled from several housing parts, for example from the two housing parts: housing upper part or cover and housing lower part or base. In this context, the plug-in socket or the plug-in socket group can be decoupled from the associated housing part of the electronic module (supported floatingly or movably in the associated housing part of the electronic module).

Due to the decoupling, tolerance problems only play a role within one plug-in socket or one plug-in socket group, that is to say only within the dimensions of the plug-in socket or plug-in socket group decoupled from the housing (these are significantly smaller than the dimensions of the housing or the housing part of the electronic module).

The plug-in socket or the plug-in socket group is embodied as a separate insert part for decoupling the plug-in socket or the plug-in socket group from the housing or the associated housing part of the electronic module. A recess corresponding to the insert part is located in the housing and especially in the associated housing part, so that the insert part and the housing or the associated housing part can be joined with one another. The connection or joint of insert part and housing or housing part is achieved by a form-fit or form-locking shape of securing elements provided on the perimeter rim of the insert part with connecting elements that are provided on the inner side of the housing or housing part and that surround the recess. After the joining of insert part and housing or housing part, the insert part is movably supported to be movable in a plane (i.e. in two directions) in the recess of the housing or housing part, and is supported nearly without play by the form-locking connection in a direction perpendicular to this plane. Upon joining of insert part and housing or housing part, the recess provided in the housing or housing part is closed in a dust-tight sealed manner, by the cooperative interaction of a protruding lip (embodied in the manner of a collar) provided on the perimeter rim of the recess, with a groove fabricated on the perimeter rim of the insert part. In that the width of the groove of the insert part is embodied larger than the width of the protruding lip (of the collar) of the housing or housing part, the movability of the insert part in the plane is ensured on the one hand, and is simultaneously limited on the other hand. The orienting of the insert part and therewith of the pin openings of the plug-in sockets or of the plug-in socket group with respect to the contact elements on the circuit support is achieved during the assembly of the circuit support with the sub-assembly of housing or housing part and insert part. Thereby, centering pins located on the insert part engage in receiver bores or holes of the circuit support and orient the insert part locally to the contact elements.

The number of the connecting elements of the housing or housing part, and therewith the number of the corresponding securing elements of the insert part, is selected depending on the size of the insert part (of the recess in the housing or housing part) and therewith the size of the plug-in socket or plug-in socket group, as well as dependent on the forces that are transmitted during the connecting or joining of insert part and housing or housing part or during the joining of the external connector plugs onto the plug-in connections or plug-in sockets.

The insert part can be produced together with the housing or the associated housing part in a common production step. Especially, in connection with a housing that consists of plastic and that is assembled from at least two housing parts, the insert part can be produced together with the associated housing part in one injection molding process through the use of one (common) family tool, so that an exact pre-assembly of housing part and insert part is possible, and thereby logistically only the pre-assembled part must be handled for the final production (assembly of the circuit support with the complete housing).

The presented electronic module incorporates and unifies several advantages:

A standardization (modular building block system) can be achieved due to the modular construction. Through the integration of the plug-in sockets and especially through integration of the plug-in socket group formed by grouping together several plug-in sockets into one insert part having smaller dimensions in comparison to the housing dimensions, the fixed functional dimensions for maintaining the tolerances set forth in the application specifications become smaller, whereby, in connection with plastic housings, the repetition or reproduction accuracy of injection molding processes can be used in the production of the insert part, in that the receiving bores or holes in the circuit support are adapted to the measured tool-contacting parts. Through an undercut-free realization of the decoupling of the plug-in sockets or plug-in socket group in the housing part and in the insert part, no (cost entailing) movable sliders are needed in the injection molding tool in connection with plastic housings produced by means of injection molding processes. Thereby the production costs of the injection molding tool are lower, short cycle times and long tool service lives arise during the production, and therewith also low part prices, and no contamination of the injection molded parts (housing part, insert part) occurs from lubricants that are necessary in connection with movable sliders (economical and ecological advantage).

The assembly of the insert part with the housing or housing part after the injection molding process is automatable in a simple manner, whereby a positioning of the insert part is enabled by use of lead-in guides provided in the housing or housing part. Due to the secure and stable securing of the insert part in the housing or housing part, and due to the sealing against external influences (especially with respect to permeating dust), no additional securing elements or sealing elements are required, despite the described decoupling. A rattling of the insert part in the housing or housing part is prevented due to the pre-tensioning between the securing elements of the insert part and the associated connecting element of the housing or housing part after the assembly of the insert part with the housing or housing part.

The electronic module will be explained in connection with an example embodiment with reference to the drawing (FIGS. 1 to 4).

Figure 2A:
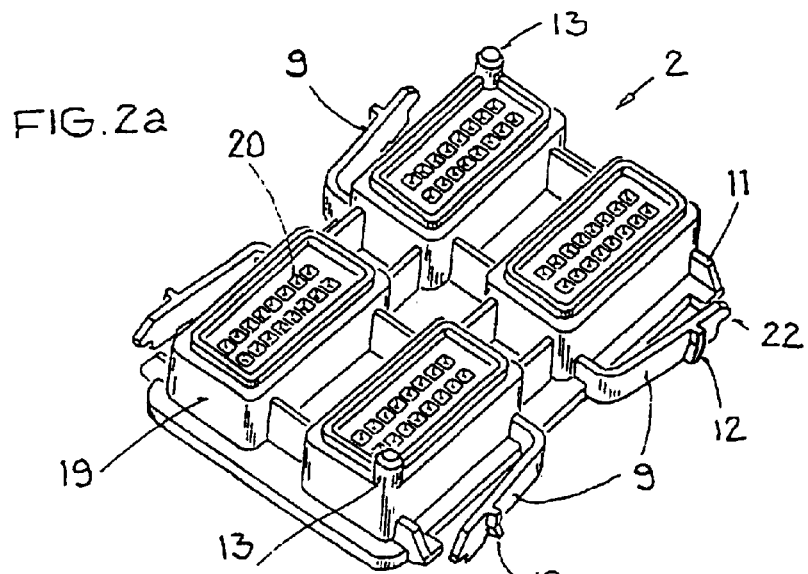
Figure 2B:
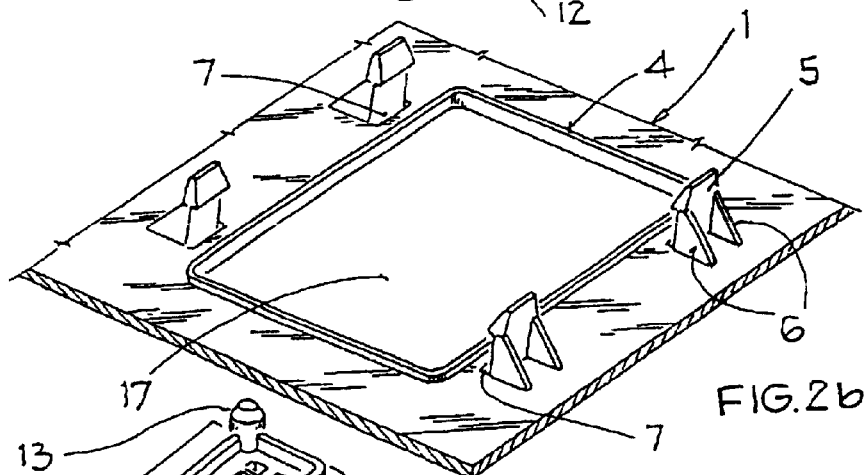
Figure 2C:
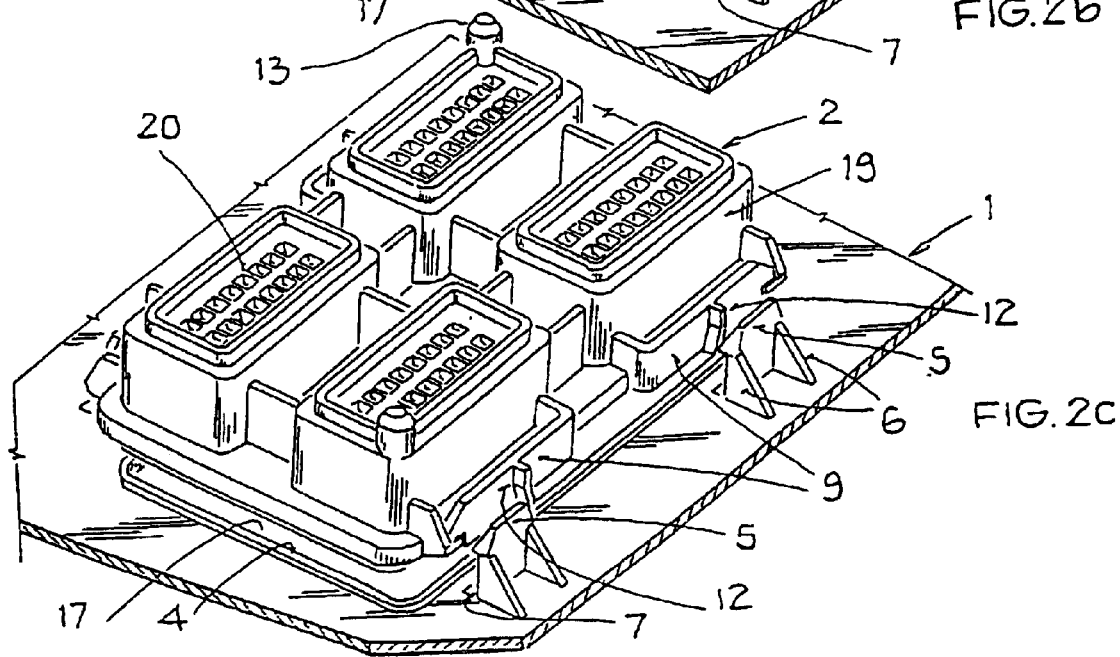
Figure 2D:
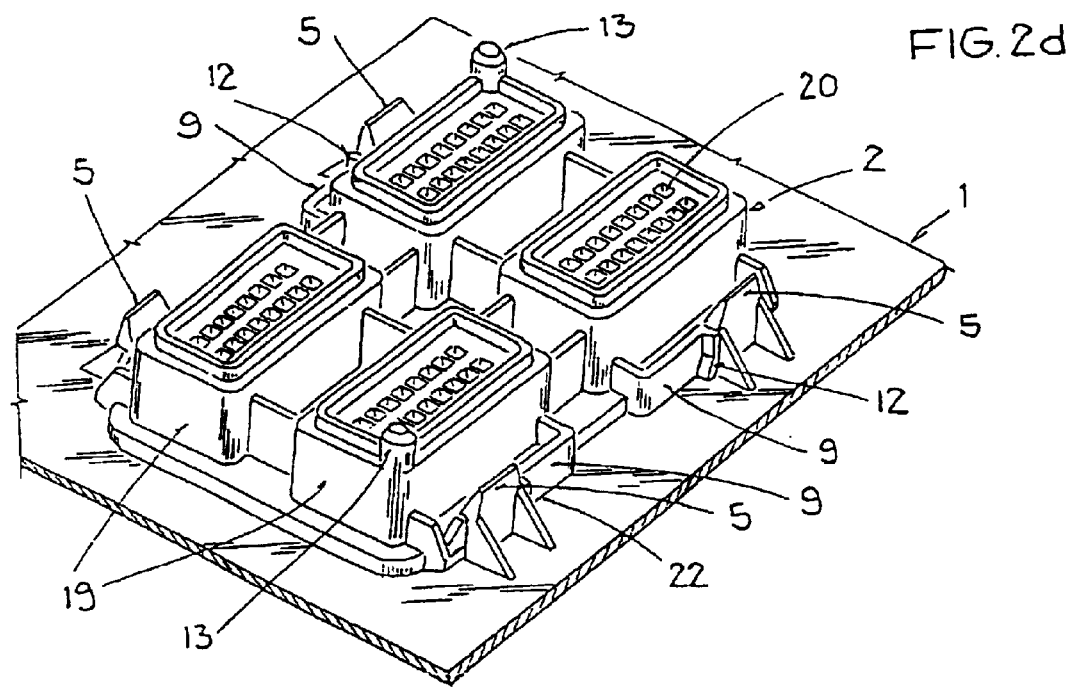
Figure 2E:
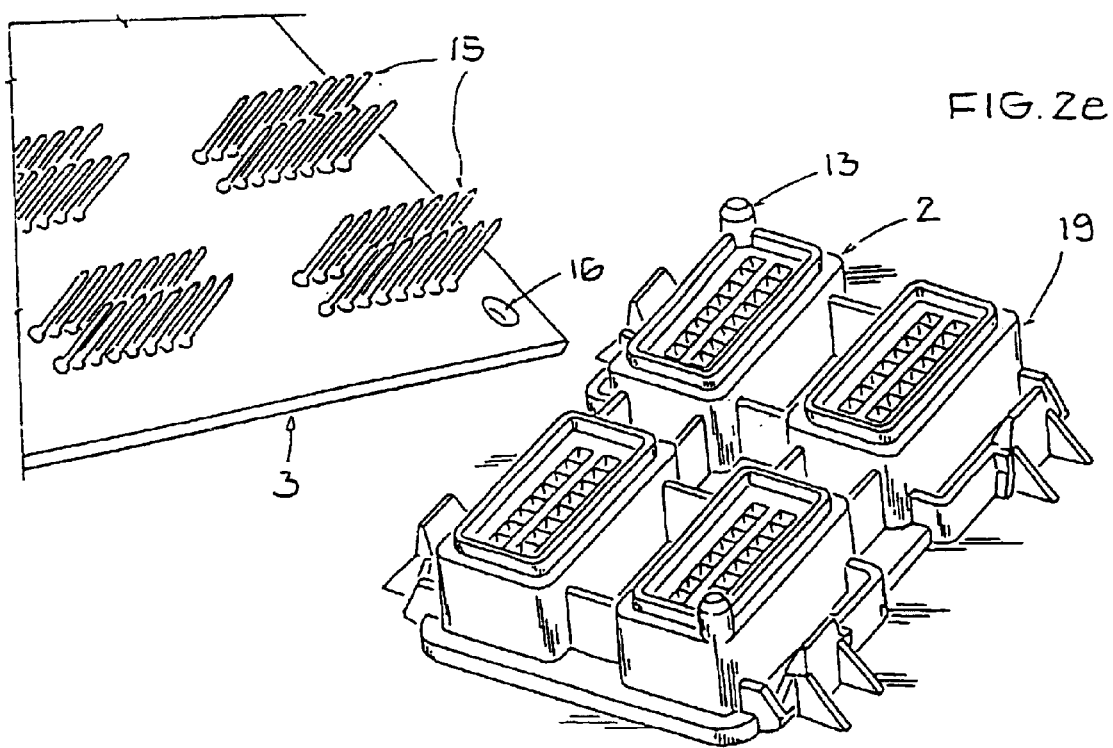
Figure 2F:
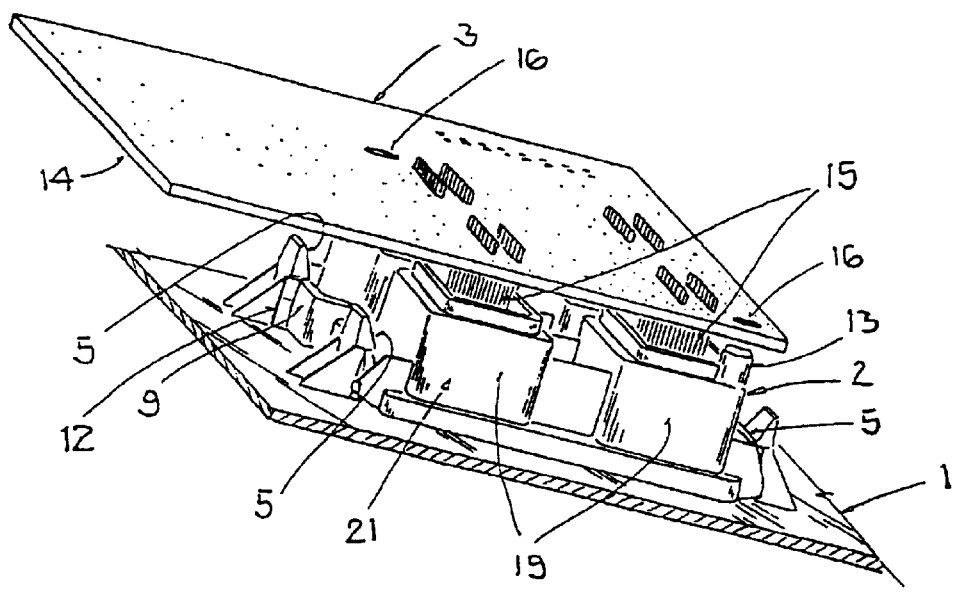
Figure 2G:
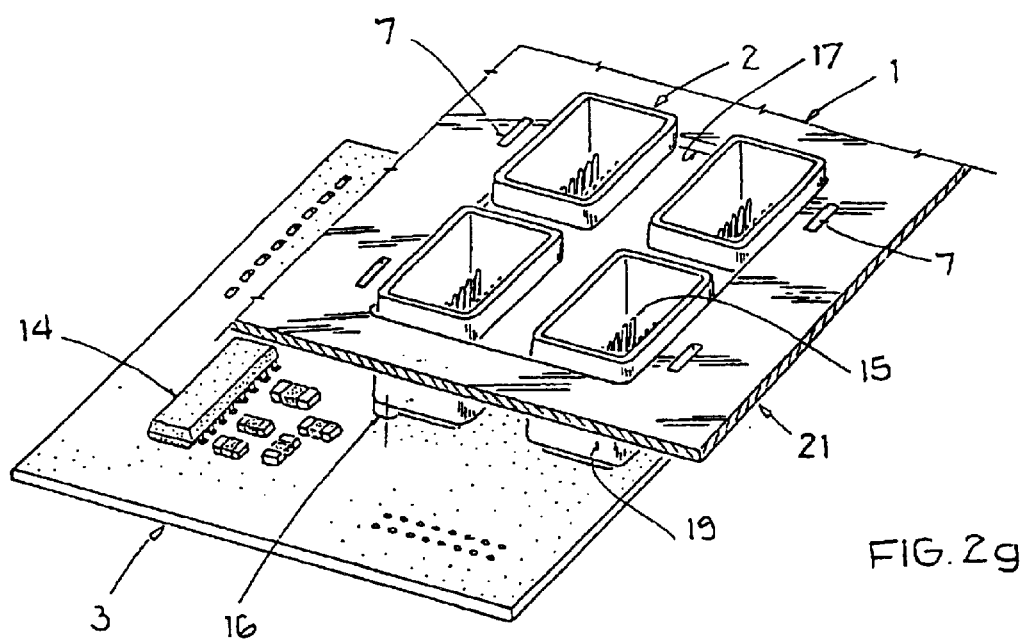
Figure 3:
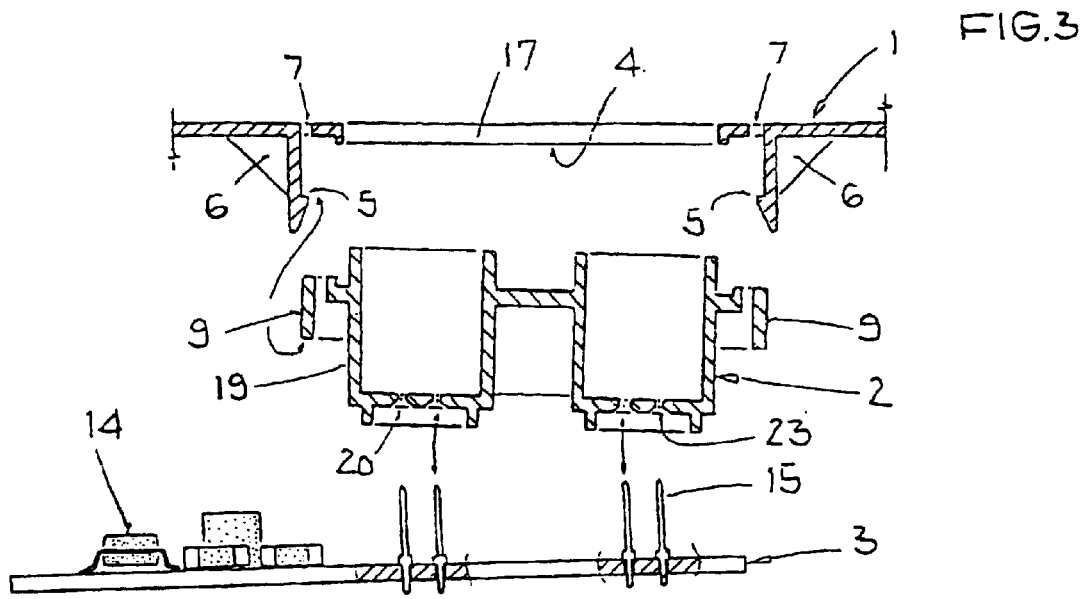
Figure 4:
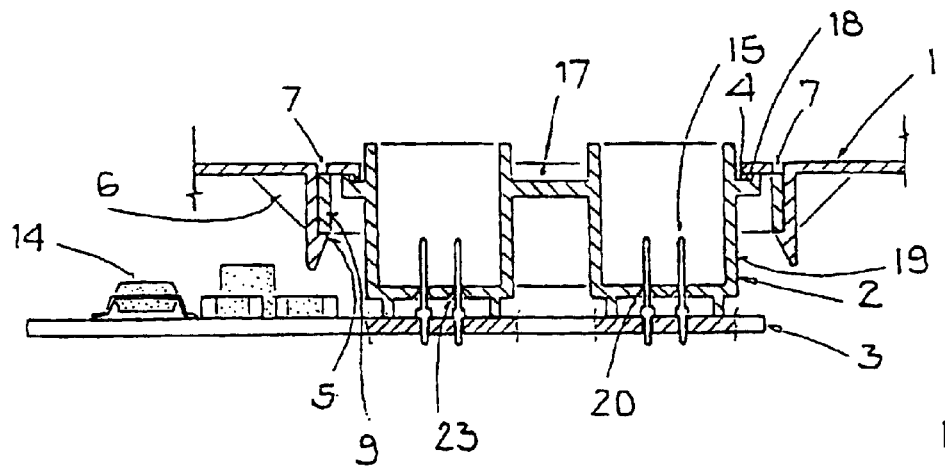

FIG. 1 shows a three-dimensional view with a cut-away portion of the electronic module, FIG. 2 shows a three-dimensional view with a cut-away portion of the electronic module in various production steps, FIG. 3 shows a side view with a cut-away portion of the electronic module before the connection of the individual parts, FIG. 4 shows a side view with a cut-away portion of the electronic module after the connection of the individual parts.

The circuit arrangement of the electronic module comprising components 14 is enclosed by a plastic housing 10, assembled from, for example, two housing parts 1, whereby respectively one cut-away portion of one of the two housing parts 1 is shown in the figures. For electrically contacting the components 14 of the circuit arrangement provided on the circuit support 3, for example embodied as a circuit board, several press-in or insertion pins as contact elements 15, for example four groups with respectively 16 press-in pins 15 which are respectively arranged in a double row, are arranged perpendicularly to the circuit board 3. These press-in pins 15 are to be inserted into plug-in sockets 19 for forming a plug-in connection 21 integrated in one of the housing parts 1, to which plug-in connection 21 corresponding connection plugs can be externally connected. The recess 17 for receiving the insert part 2 is provided in the housing part 1 and is surrounded by several release openings 7. At least one plug-in socket 19 comprising pin openings 20 for receiving the press-in pins 15 is provided in the insert part 2. For example, for forming the plug-in connection 21 it is necessary to provide a connection of the four groups of respectively 16 press-in pins 15 that are respectively arranged in a double row, with the plug-in socket group integrated in the insert part 2 with four plug-in sockets 19 with respectively 16 pin openings 20 that are respectively arranged in a double row.

In the area of the plug-in connection 21 to be formed, the housing part 1 possesses, on its inner side, a protruding lip 4 that is embodied as a collar and that extends around the recess 17, several (for example four) rigid non-springy catch hooks 5 with strengthening ribs 6 as well as release openings 7 for realizing the undercut-free embodiment of the catch hooks 5 in the injection molding tool (whereby movable sliders can be avoided in the upper part of the injection molding tool).

The insert part 2 possesses: a plug-in socket group with, for example, four plug-in sockets 19 (for example with a total of 64 pin openings 20, which are allocated to the four plug sockets 19 of the plug socket group); a groove 8 which extends around the outside or perimeter rim, and which corresponds with the collar 4 arranged on the inner surface of the housing part, and by means of which a labyrinth seal against permeating dust is formed due to the nesting engagement of the collar 4 in the groove 8 and simultaneously a support of the insert part 2 against tensile loading during the contacting of the plug-in sockets 19 is realized; several securing elements 22 (for example four securing element 22), which correspond with the catch hooks 5 of the housing part 1, for supporting or bracing the connected assembly of insert part 2 and housing part 1 against compressive loading during the contacting of the plug-in sockets 19 or plug-in connections 21 in a direction perpendicular to the tolerance compensating plane, for avoiding force influences on the circuit board 3; as well as (for example two) centering pins 13 (chamfers or bevels) as centering aids for the connection of the insert part 2 with the circuit board 3 in the formation of the plug-in connection 21. For ensuring a tolerance compensation in the formation of the plug-in connection 21, groove 8 and corresponding collar 4 are embodied with a play-fit (that is to say the groove 8 is provided with an over-dimension). According to the illustrated example embodiment, the securing elements 22 are formed by the form-locking engagement of a snap element 9 (snap hook) with a protrusion or protruding shoulder 11 during the joining of the insert part 2 with the housing part 1, whereby the take-up of high compressive force loads is ensured. The form-locking connection based on the principle of the shortening of the bending lengths is improved with the use of a protruding shoulder 11. In connection with small forces, a take-up of the compressive force load can also be achieved solely by the snap elements 9 (snap hooks), so that the securing elements 22 can be embodied without protruding shoulder 11. Alternatively to this, the securing elements 22 can be fixedly connected on the insert part 2 at two points in the manner of a bail; these securing elements 22 can be embodied rigidly or elastically in the direction of the required tolerance compensation, whereby, with a rigid embodiment of the securing elements 22, the corresponding catch hooks 5 of the housing part 1 are embodied elastically. Moreover, the securing elements 22 may comprise integrated seals 10 and lead-in guides 12 for the positioning of the insert part 2 with respect to the catch hooks 5.

On the circuit board 3 there are provided, for example 64 press-in pins 15 for contacting the components 14 (for example resistors, transistors, capacitors, etc.), as well as for example two receiver bores or holes 16 corresponding to the two centering pins 13 of the insert part 2 for the (self-finding) orientation of the insert part 2 with respect to the circuit board 3 in the formation of the plug-in connection 21. The pin openings 20 of the plug-in sockets 19 comprise lead-in slopes or bevels 23 (see, in this regard, FIG. 3 and FIG. 4) for guiding in the press-in pins 15 in the formation of the plug-in connection 21.

The following method steps are provided for the formation of the plug-in connection 21 (in this regard see especially the FIG. 2): The insert part 2 with the plug-in socket group including four plug-in sockets 19 (FIG. 2a) is moved vertically in the direction of the recess 17 of the housing part 1 for insertion into the housing part 1 (FIG. 2b). Thereby, the catch hooks 5 on the inner side of the housing part 1 at an early time engage into the lead-in guides 12 of the securing elements 22 provided on the outer side of the insert part 2 and thereby facilitate the self-finding connection or joining of insert part 2 and housing part 1. Simultaneously, the snap elements 9 of the insert part 2 are pressed under the protruding shoulders 11 of the insert part 2 by the catch hooks 5, and thereby the securing elements 22 are formed (FIG. 2c). The assembly motion is ended by the seating of the groove 8 extending around the insert part 2 onto the collar 4 that is provided on the inner side of the housing part 1 and that surrounds the recess 17. At this time point, the snap elements 9 have also passed the undercut of the catch hooks 5, and spring back so far until this resetting or recovering movement is limited by the catch hooks 5. Thereby, the snap elements 9 remain under residual tension; hereby a non-rattling connection or joining of the insert part 2 with the housing part 1 is ensured (FIG. 2d). After the joining of housing part 1 and insert part 2, a labyrinth seal 18 is formed by the cooperative interaction of the groove 8 extending around on the insert part 2 and the collar 4 provided on the inner side of the housing part 1 (see the sectional illustration of the FIG. 4). Preferably the groove 8 is embodied wider than the collar 4, so that a sliding displacement of the insert part 2 with respect to the recess 17 in the housing part 1, and therewith a positioning of the insert part 2 or a tolerance compensation in the plane of the housing floor of the housing part 1, into which the insert part 2 is inserted, is made possible. If the collar 4 is arranged centrally relative to the groove 8, a sliding displacement of the insert part 2 with respect to the housing floor of the housing part 1 and therewith a tolerance compensation over a distance corresponding to half of the difference between the width of the groove 8 and the width of the collar 4 can be achieved. If, for the tolerance compensation, the insert part 2 is moved perpendicularly to the longitudinal direction of the securing elements 22, individual snap elements 9 are de-tensioned (i.e. relaxed) or further pre-tensioned; with a movement in the longitudinal direction of the securing elements 22, the friction between the snap elements 9 and the catch hooks 5 must be overcome. Hereby, a rattle-free positioning of the insert part 2 and therewith of the plug-in sockets 19 of the plug-in socket group or of the pin openings 20 of the plug-in sockets 19 with respect to the press-in pins 15 is realizable. The release openings 7 provided in the housing part 1 for avoiding undercuts and the complicated and costly sliders that are necessitated by such undercuts in the injection molding tool, are closed by parts of the securing elements 22 through the joining of housing part 1 and insert part 2, especially by the snap elements 9 which are tuned or tailored to the release openings 7 in their geometry (width, thickness, height). After the assembly of housing part 1 and insert part 2, the insert part 2 integrated in the housing part 1 is connected with the circuit board 3 or with the press-in pins 15 of the circuit board 3, and hereby the plug-in connection 21 is formed (FIG. 2e to FIG. 2g). For this, the press-in pins 15 are pushed centrally through the pin openings 20 of the plug-in sockets 19 with the aid of the lead-in slopes or bevels 23 provided in the pin openings 20 (in this regard see FIG. 3 and FIG. 4). Once circuit board 3 and insert part 2 have sufficiently approached one another (FIG. 2f), the centering pins 13 of the insert part 2 begin to plunge into the receiving bores or holes 16 of the circuit board 3, whereby the insert part 2 is finally oriented with respect to the circuit board 3 in connection with a relative movement in the housing part 1 that makes a tolerance compensation possible. Thereby, the press-in pins 15 are exactly positioned to the corresponding pin openings 20 of the plug-in sockets 19 of the plug-in socket group (FIG. 2g). A corresponding external connection plug is connected to the plug-in connection 21 integrated in the housing part 1. Due to the form-locking connection between snap element 9 and protruding shoulder 11 (protruding formation of the securing element 22), and the stiffness in the vertical direction (perpendicular to the plane of the housing part 1) that is necessitated hereby, a tension or compression force relief is realized, depending in which direction the form-locking connection is effective, whereby the contact forces that arise in this regard are transmitted through the insert part 2 without great bending lengths onto the housing part 1, and do not load the circuit board 3 lying thereunder.

As a result of the above, an electronic module can be realized, with the following features.

The plug-in sockets integrated in the housing or in at least a housing part can be grouped and combined together in a simple manner to individual plug-in socket groups.

A decoupling of these plug-in sockets relative to the contact elements on the circuit support can be realized without undercuts in the tools provided for the production of the housing or housing part.

A play-free connection or joining of insert part and housing or housing part is made possible with the use of an assembly aid, in which a rattling of the insert part is avoided by pre-tensioning of the snap elements of the insert part, and in which the release openings provided in the housing part (for avoiding undercuts) are covered and sealed by parts of the insert part.

With centering pins additionally provided on the insert part, a positioning of the insert part integrated in the housing or housing part on the circuit support for forming the plug-in connection is made possible.

What is claimed is:

1. Electronic module with contact elements (15) arranged on a circuit support (3), with a housing (10) enclosing the circuit support (3) and with at least one plug-in connection (21) integrated in the housing (10), characterized in that, an insert part (2) comprising pin openings (20) is movably supported in a recess (17) of the housing (10), and in that the pin openings (20) are orientable with respect to the contact elements (15) during the joining of the insert part (2) with the circuit support (3) for forming the plug-in connection (21), through an over-dimensioning at the junction location of insert part (2) and housing (1).

2. Electronic module according to claim 1, characterized in that the insert part (2) comprises at least one plug-in socket (19), in which several pin openings (20) are grouped together, and in that the at least one plug-in socket (19) is oriented with respect to the contact elements (15) during the joining of the insert part (2) with the circuit support (3) for forming the plug-in connection (21).

3. Electronic module according to claim 1, characterized in that the insert part (2) comprises a plug-in socket group with at least two plug-in sockets (19), and in that the plug-in socket group is oriented with respect to the contact elements (15) during the joining of the insert part (2) with the circuit support (3) for forming the plug-in connection (21).

4. Electronic module according to claim 1, characterized in that the insert part (2) comprises on its rim a groove (8) extending therearound, in that the housing (10) comprises a protruding lip (4) surrounding the recess (17), and in that the protruding lip (4) engages in the groove (8) for the dust-tight sealing of the housing (10) during the joining of insert part (2) and housing (10).

5. Electronic module according to claim 4, characterized in that the width of the groove (8) is selected larger than the width of the protruding lip (4), so that the pin openings (20) of the insert part (2) are slidably displaceable with respect to the contact elements (15) during the joining of the insert part (2) with the circuit support (3) for forming the plug-in connection (21).

6. Electronic module according to claim 1, characterized in that the housing (10) on its inner side comprises catch hooks (5) on the perimeter rim of the recess (17), in that the insert part (2) on its outer side comprises securing elements (22) corresponding to the catch hooks (5), and in that the securing elements (22) engage in the corresponding catch hooks (5) during the joining of insert part (2) and housing (10).

7. Electronic module according to claim 6, characterized in that the securing elements (22) of the insert part (2) comprise a snap element (9), a protruding shoulder (11) as well as a lead-in guide (12) for positioning the securing elements (22) of the insert part (2) with respect to the catch hooks (5) of the housing (10).

8. Electronic module according to claim 7, characterized in that the insert part (2), during the joining with the circuit support (3) for forming the plug-in connection (21), is movable in the plane of the housing (10) through the snap elements (9).

9. Electronic module according to claim 7, characterized in that a stiffness perpendicular to the plane of the housing (10) is realized by a form-locking connection between snap element (9) and protruding shoulder (11) of the securing elements (22) during the joining of insert part (2) and housing (10).

10. Electronic module according to claim 1, characterized in that the housing (10) comprises release openings (7) surrounding the recesses (17).

11. Electronic module according to claim 6, characterized in that the housing (10) comprises release openings (7) surrounding the recesses (17), and in that the securing elements (22) of the insert part (2) close the release openings (7) during the joining of insert part (2) and housing (10).

12. Electronic module according to claim 1, characterized in that the contact elements (15) are embodied as press-in contacts, which are guided into lead-in bevels (23) of the pin openings (20) during the joining of the insert part (2) with the circuit support (3) for forming the plug-in connection (21).

13. Electronic module according to claim 1, characterized in that the housing (10) is assembled of at least two housing parts (1), and in that a plug-in connection (21) is integrated in at least one housing part (1).

14. Electronic module according to claim 1, characterized in that the housing (10) consists of plastic and is produced as an injection molded part.

* * * * *